(12) United States Patent
Saiki et al.

(10) Patent No.: US 11,639,947 B2
(45) Date of Patent: May 2, 2023

(54) METHOD OF DETECTING FOREIGN OBJECT ON STAGE AND DETECTION APPARATUS

(71) Applicant: Tokyo Electron Limited, Tokyo (JP)

(72) Inventors: Kenta Saiki, Yamanashi (JP); Takuya Ishida, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 205 days.

(21) Appl. No.: 17/116,201

(22) Filed: Dec. 9, 2020

(65) Prior Publication Data

US 2021/0215742 A1 Jul. 15, 2021

(30) Foreign Application Priority Data

Jan. 10, 2020 (JP) .............................. JP2020-002964

(51) Int. Cl.
*G01R 3/00* (2006.01)
*G01R 31/28* (2006.01)
*G06T 7/00* (2017.01)
*G01N 21/95* (2006.01)
*G01N 21/94* (2006.01)
*G06T 7/73* (2017.01)

(52) U.S. Cl.
CPC .............. *G01R 3/00* (2013.01); *G01N 21/94* (2013.01); *G01N 21/9501* (2013.01); *G01R 31/2831* (2013.01); *G06T 7/001* (2013.01); *G06T 7/74* (2017.01)

(58) Field of Classification Search
CPC ...... G01R 3/00; G01R 31/2831; G01N 21/94; G01N 21/9501; G01N 21/01; G01N 21/8851; G06T 7/001; G06T 7/74; H01L 21/67103; H01L 21/67253; H01L 21/67288; H01L 21/681; H01L 21/68742; H01L 21/6838; H01L 21/67294; H01L 22/30; H01L 22/12

See application file for complete search history.

(56) References Cited

U.S. PATENT DOCUMENTS

| | | | |
|---|---|---|---|
| 2013/0115030 A1* | 5/2013 | Nisany | H01L 21/68707 414/225.01 |
| 2018/0025953 A1* | 1/2018 | Yoshihara | H01L 21/681 438/14 |
| 2020/0166542 A1* | 5/2020 | Watanabe | G01R 1/06794 |

FOREIGN PATENT DOCUMENTS

| | | | | |
|---|---|---|---|---|
| JP | 2003-234265 | | 8/2003 | |
| JP | 2011-163804 | | 8/2011 | |
| JP | 2011163804 A | * | 8/2011 | ........... G01N 21/956 |

* cited by examiner

*Primary Examiner* — Roy M Punnoose
(74) *Attorney, Agent, or Firm* — IPUSA, PLLC

(57) ABSTRACT

A method of detecting a foreign object on a stage according to one aspect of the present disclosure includes acquiring first position information of a first pattern included in a first image in a reference state of a surface of the stage capable of attracting an object to be inspected; acquiring second position information of a second pattern included in a second image of the surface, the second image being obtained after obtaining the first image; and detecting one or more foreign objects on the surface by comparing the first position information and the second position information.

14 Claims, 4 Drawing Sheets

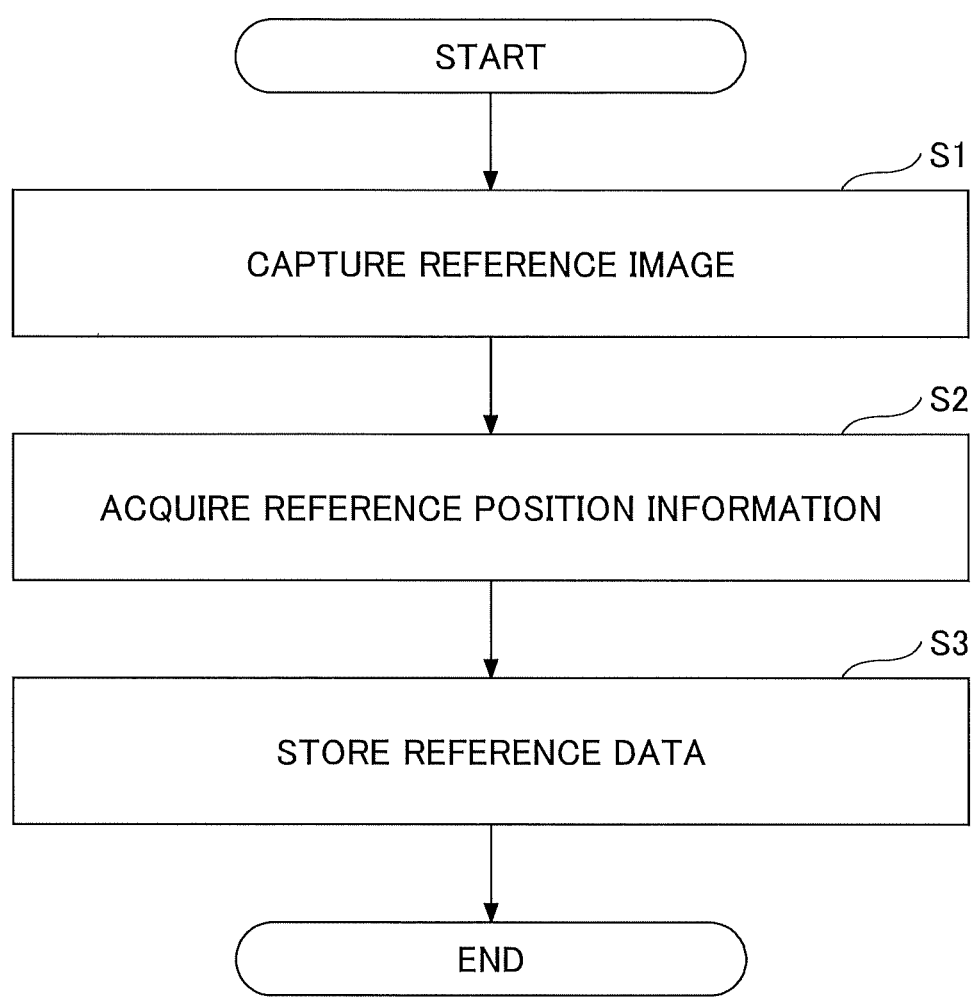

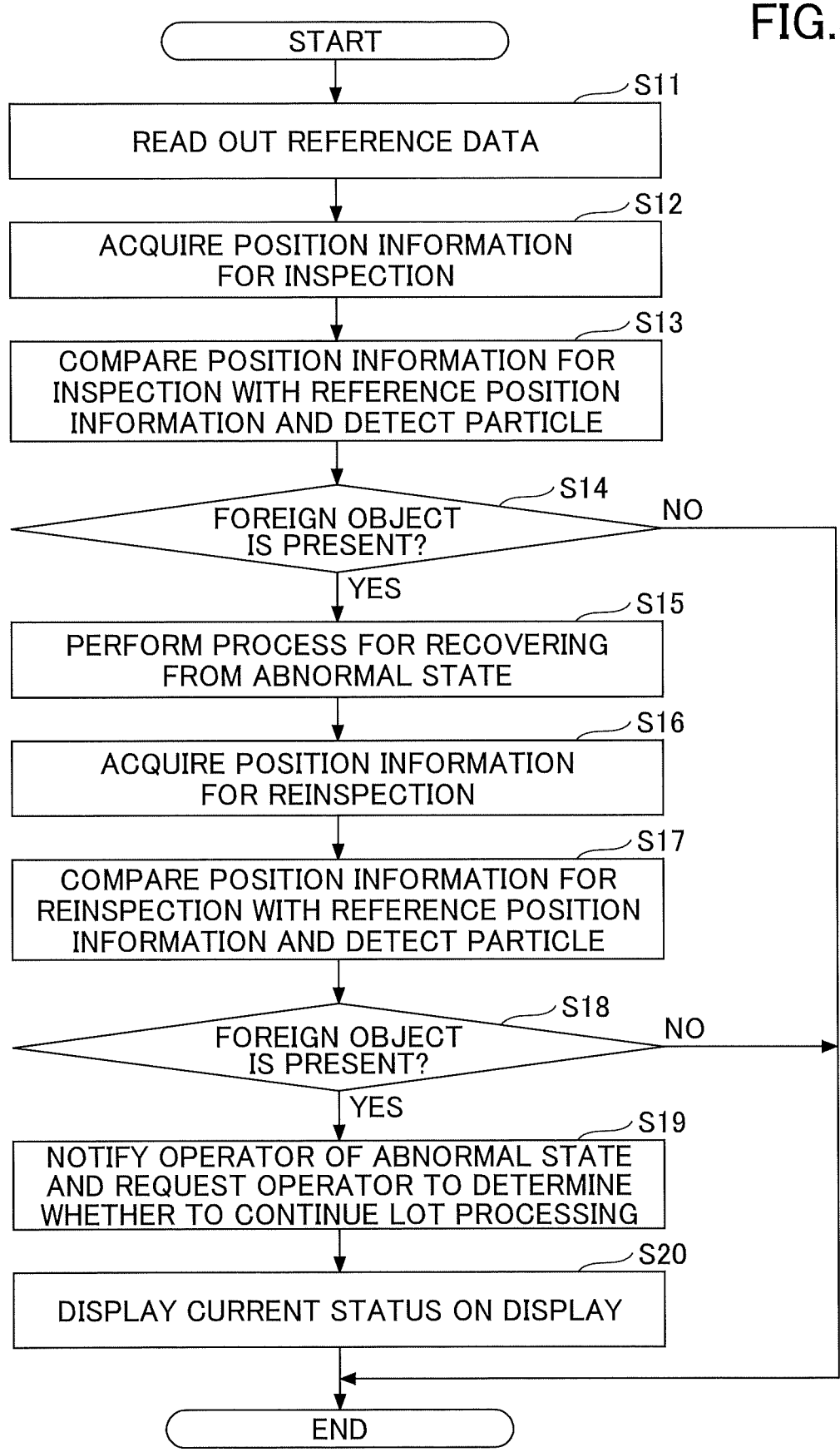

METHOD OF DETECTING FOREIGN OBJECT ON STAGE AND DETECTION APPARATUS

CROSS-REFERENCE TO RELATED APPLICATIONS

This patent application is based upon and claims priority to Japanese Patent Application No. 2020-002964 filed on Jan. 10, 2020, the entire contents of which are incorporated herein by reference.

TECHNICAL FIELD

The present disclosure relates to a method of detecting foreign object on stage and a detection apparatus.

BACKGROUND

Patent Document 1 discloses a foreign object detection apparatus that includes a target pixel extracting part that detects brightness of all pixels included in an image of an inspection object, and extracts a target pixel among all the pixels based on the brightness, a brightness difference detecting part that detects a brightness difference between the target pixel and a plurality of peripheral pixels located around the target pixel, and a foreign object determining part that determines presence or absence of a foreign object based on the brightness difference.

CITATION LIST

Patent Document

[Patent Document 1] Japanese Laid-open Patent Application Publication No. 2011-163804

SUMMARY

The present disclosure provides a technique for detecting a foreign object on a surface of a stage capable of attracting an object to be inspected.

A method of detecting a foreign object on a stage according to one aspect of the present disclosure includes acquiring first position information of a first pattern included in a first image in a reference state of a surface of the stage capable of attracting an object to be inspected; acquiring second position information of a second pattern included in a second image of the surface, the second image being obtained after obtaining the first image; and detecting one or more foreign objects on the surface by comparing the first position information and the second position information.

BRIEF DESCRIPTION OF THE DRAWINGS

FIG. 4 is a flowchart illustrating an example of processes performed for acquiring reference data; and FIG. 5 is a flowchart illustrating an example of processes performed for acquiring position information for inspection and for detecting a foreign object.

DETAILED DESCRIPTION OF EMBODIMENTS

Figure 1:
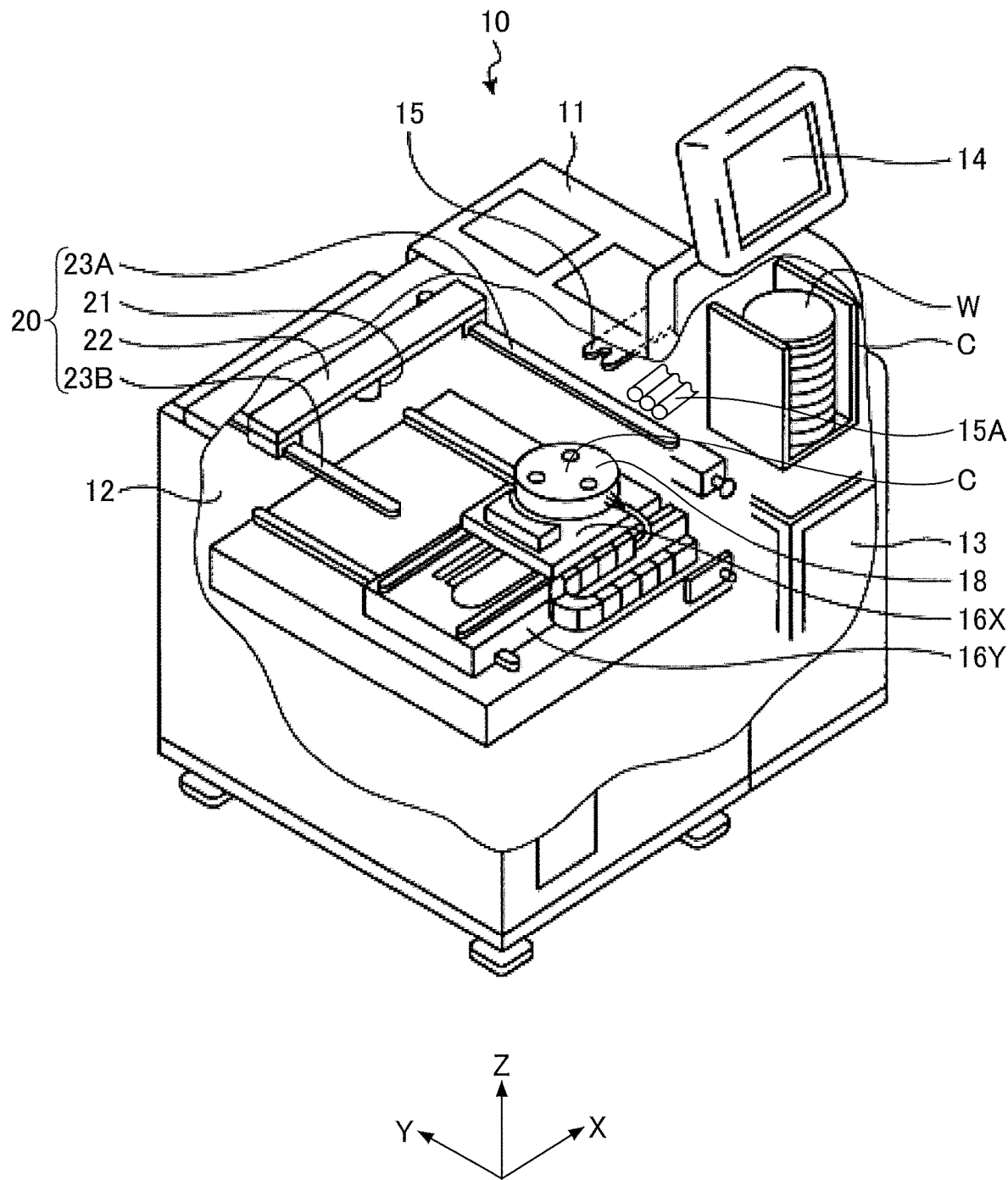
FIG. 1 is a diagram illustrating an example of an inspection device according to an embodiment.

Hereinafter, a non-limiting embodiment of the present disclosure will be described with reference to the accompanying drawings. In all the accompanying drawings, the same or corresponding reference numerals shall be attached to the same or corresponding components and the description thereof will not be repeated.

The non-limiting embodiment of the present disclosure will be described with up-and-down direction (vertical direction) or upper-and-lower relation as illustrated in the accompanying drawings. However, the up-and-down direction (vertical direction) or the upper-and-lower relation do not represent a universal up-and-down direction (universal vertical direction) or a universal upper-and-lower relationship.

Embodiment

FIG. 1 is a diagram illustrating an example of an inspection device 10 according to the embodiment. In FIG. 1, for convenience of explanation, the inspection device 10 is illustrated in such a manner that a portion thereof is cut out. As illustrated in FIG. 1, the inspection device 10 includes a loader chamber 11, a prober chamber 12, a controller 13, and a display 14.

The loader chamber 11 includes a transfer arm 15 that is an example of a transfer unit. The transfer arm 15 conveys a semiconductor wafer (hereinafter, referred to as a "wafer") W, which is a substrate contained in the cassette C, into the prober chamber 12. The wafer W is an example of an object to be inspected. The transfer arm 15 conveys the inspected wafer W from the prober chamber 12 to a designated export position.

The prober chamber 12 inspects electrical characteristics of the wafer W conveyed by the transfer arm 15. The prober chamber 12 is provided with an X-stage 16X and a Y-stage 16Y that move a stage 18 in the vertical direction (the Z-axis direction in FIG. 1) and the lateral direction (a direction included in the XY plane parallel to the X-axis and Y-axis in FIG. 1). The wafer W is conveyed on the stage 18 by the transfer arm 15, and the stage 18 attracts and holds the mounted wafer W to an upper surface of the stage 18 by vacuum suction or the like. The upper surface of the stage 18 is an example of the surface of the stage 18. FIG. 1 illustrates the center C of the upper surface of a disc-shaped stage 18.

Figure 2:
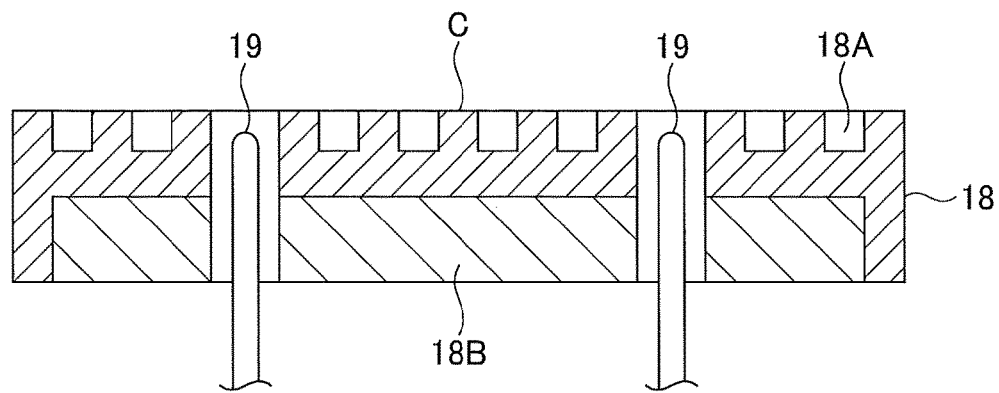
FIG. 2 is a cross-sectional view illustrating an example of a stage according to the present embodiment.

FIG. 2 is a cross-sectional view illustrating an example of the stage 18 according to the present embodiment. The cross-section as illustrated in FIG. 2 is a cross-section that passes through the center C of the upper surface of the stage 18. As illustrated in FIG. 2, the stage 18 is provided with pins 19 that are moved up and down by a drive unit (not illustrated) and that are projected upwardly from the stage 18 and are retracted downwardly into the stage 18. The pins 19 temporarily project from the stage 18 to support the wafer W above the stage 18 when the wafer W is conveyed onto the stage 18 and when the wafer W is conveyed out from the stage 18.

The three pins 19 are provided as an example. FIG. 2 illustrates a suction groove 18A, that is used for a vacuum chuck of the stage 18, and a heater 18B in a simplified manner. The stage 18 is provided with the vacuum chuck that applies suction to the wafer W through the suction groove 18A, in a state where the wafer W is mounted on the upper surface of the stage 18, and attracts the wafer W onto the upper surface of the stage 18. An operational state of the vacuum chuck is controlled by the controller 13. The controller 13 switches between a suction state and non-suction state of the wafer W.

The heater 18B is provided inside the stage 18. The heater 18B is provided, for example, to heat the wafer W to a temperature set for an operation test in a case where the wafer W is mounted on the stage 18 to inspect electrical characteristics of electronic devices formed on the wafer W by performing the operation test. In addition to the heater 18B, a cooling unit for cooling the stage 18 may be provided with the stage 18.

Returning to the description with respect to FIG. 1, the prober chamber 12 is provided with an alignment apparatus 20 and a probe card (not illustrated). The alignment apparatus 20 is an alignment apparatus of an optical bridge that aligns the wafer W mounted on the stage 18 to a designated inspection position. The alignment apparatus 20 includes a camera 21, an alignment bridge 22, and a pair of linear guides 23A and 23B. The camera 21 is mounted on the alignment bridge 22 such that an imaging direction faces downward. The alignment bridge 22 is supported by the pair of linear guides 23A and 23B movably in the Y-axis direction. The alignment bridge 22 is connected to a moving unit, not illustrated, that moves the alignment bridge 22 in the Y-axis direction. As the alignment bridge 22 is moved in the Y-axis direction by the moving unit, the camera 21 mounted on the alignment bridge 22 is also moved in the Y-axis direction. The moving unit is controlled by the controller 13, and an amount of the movement of the camera 21 and the alignment bridge 22 is controlled by the controller 13.

In a case where the alignment of the wafer W mounted on the stage 18 is performed, the alignment bridge 22 is moved along the pair of linear guides 23A and 23B from a standby position in the Y-axis direction by the moving unit (not illustrated). As the alignment bridge 22 moves in the Y-axis direction, the camera 21 mounted on the alignment bridge 22 also moves in the Y-axis direction and reaches a preset alignment position below the probe card. In this state, the camera 21 mounted on the alignment bridge 22 and a camera (not illustrated) fixed to the stage 18 perform a cooperative process such that the alignment of the wafer W mounted on the stage 18 is performed. Thereafter, the alignment bridge 22 is returned to the original standby position by the moving unit (not illustrated).

A blower 15A is provided in the prober chamber 12. The blower 15A is an example of a cleaning device. The blower 15A is a device that can blow nitrogen gas, from the positive X direction side as an example, onto the upper surface of the stage 18 located at a position where the stage 18 receives the wafer W from the transfer arm 15. FIG. 1 illustrates the blower 15A in a simplified manner, and only illustrates tip portions of a plurality of nozzles that blow the nitrogen gas. For example, the nozzles of the blower 15A are arranged in the Y direction. The blower 15A is controlled by the controller 13 and blows the nitrogen gas toward the upper surface of the stage 18 so as to blow off a foreign object or the like located on the upper surface and to clean the upper surface under a desired condition.

The probe card also includes probe needles used for inspecting the electrical characteristics of the wafer W aligned by the alignment apparatus 20. The probe card is fixed to an opening, via an insert ring, located in the middle of a head plate that is capable of opening and closing with respect to a ceiling surface of the prober chamber 12. A test head (not illustrated) is pivotally disposed on the prober chamber 12.

In a case where the inspection of the wafer W mounted on the stage 18 is performed, first, the probe card and the tester (not illustrated) are electrically connected through the test head. Then, designated signals are output from the tester to the wafer W mounted on the stage 18 via the probe card, and response signals of the wafer W are output to the tester via the probe card. As a result, the electrical characteristics of the wafer W are evaluated by the tester. After completing the inspection of the electrical characteristics of the wafer W, the pins 19 are protruded from the stage 18 and the wafer W is lifted up by the pins 19. The transfer arm 15 moves to the stage 18 and receives the wafer W lifted up by the pins 19, and then the wafer W is conveyed to the designated export position by the transfer arm 15.

The inspection device 10 having the above-described configurations is generally controlled by the controller 13. The controller 13 includes a program, memory, a data processing unit that is composed of a central processing unit (CPU), or the like. The controller 13 executes the program, sends control signals to each section of the inspection device 10, performs various steps described below for details, and conveys out the wafer W. For example, the memory includes areas in which values of various processing parameters are written. When the CPU executes each instruction of the program, the various parameters are read out, and control signals corresponding to the values of the various processing parameters are sent to each portion of the inspection device 10. The program (including programs related to input operations and display of the various processing parameters) is stored in a storage part such as a computer readable storage medium, and is installed in the controller 13. Examples of the computer readable storage medium are a flexible disk, a compact disk, a magneto-optical (MO) disk, and the like.

For example, the controller 13 controls each part of the inspection device 10. As a detailed example, the controller 13 moves the camera 21 above a predetermined area in which a peripheral part of the wafer W is to be located, while the wafer W is lifted up by the pins 19 that are protruded from the stage 18, and while a command to start the transfer of the wafer W mounted on the stage 18 is issued to the transfer arm 15 and the transfer arm 15 moves to the stage 18. The controller 13 causes the moved camera 21 to image an imaging region including the wafer W. Then the controller 13 detects displacement of the wafer W (planar displacement or tilt of the wafer W), that is lifted up by the pins 19, based on the image captured by the camera 21.

Next, "method of detecting a foreign object on a stage" and "detection apparatus for detecting a foreign object on a stage" according to the embodiment will be described.

The controller 13 functions as the "detection apparatus for detecting a foreign object on a stage" according to the present embodiment, and detects whether or not the foreign object is located on the upper surface of the stage 18. The method of detecting whether or not the foreign object is located on the upper surface of the stage 18, performed by the controller 13, is the "method of detecting a foreign object on a stage" according to the present embodiment. The foreign object is, for example, a particle having an area or a size, in plan view, greater than or equal to a designated threshold value among particles, such as fine particles, dust, or the like, that can adhere to the upper surface of the stage 18.

For example, as the "detection apparatus for detecting a foreign object on a stage", the controller 13 according to the present embodiment has seven functions. The seven functions include, as an example, a training function, a particle detection function, a foreign object detection function, a recovery function, an operator call function, a result check function, and a storage function.

The controller 13, by performing the training function, captures an image (a reference image) of the upper surface of the stage 18 in a state where the upper surface of the stage 18 is cleaned. A state in which the upper surface of the stage 18 is cleaned is an example of a reference state. The controller 13 acquires reference data including position information (reference position information) of one or more patterns included in the reference image and an imaging condition when the reference image is captured (imaged). The controller 13 stores the reference data in an internal memory. The reference image is an example of a first image. The reference position information is an example of a first position information, and the one or more patterns included in the reference image is an example of a first pattern.

The reference image is captured in a state where the camera 21 of the alignment apparatus 20 is placed right above the stage 18. Since the reference image includes information of the suction groove 18A, various pattern(s), scratch(es) and the like that can be seen on the upper surface of the stage 18, patterns included in the reference image represent planar shapes of the suction groove 18A, the various pattern(s), the scratch(es) and the like. Therefore, the reference position information represents positions of the suction groove 18A, the various pattern(s), the scratch(es) and the like. For example, each of the positions of the suction groove 18A, the various pattern(s), the scratch(es) and the like, is represented by coordinates of two vertices located on a diagonal line of a circumscribed rectangle of the corresponding suction groove 18A, the various pattern(s), the scratch(es) or the like in an XY coordinate system that has the origin located at the center of the upper surface of the stage 18. A plurality of the reference data may be stored in the internal memory of the controller 13.

The controller 13, by performing the particle detection function and the foreign object detection function, captures an image (an image for inspection) of the upper surface of the stage 18 at a certain point in time after capturing the reference image. The controller 13 acquires inspection data including position information (position information for inspection) of a pattern included in the image for inspection and an imaging condition when the image for inspection is captured. The controller 13 compares the reference position information of the reference data stored in the internal memory with the position information for inspection of the inspection data, and determines whether any foreign object is present among the particles located on the upper surface of the stage 18. A difference between the reference position information and the position information for inspection represents the particle. The controller 13 detects the particle that has the area or the size, in plan view, greater than or equal to the designated threshold value as the foreign object. In such a manner, the controller 13 detects the foreign object located on the upper surface of the stage 18. The image for inspection is an example of a second image that is captured by the camera 21 placed right above the stage 18 under the same imaging condition as that of the reference image. The position information for inspection is an example of a second position information, and the pattern included in the image for inspection is an example of a second pattern.

At a certain point in time after capturing the reference image, time has passed since the upper surface of the stage 18 was cleaned; therefore, there may be one or more particles on the upper surface of the stage 18 that were not present at the time the cleaning was performed. Thus, the image for inspection may include information of the one or more particles other than the information of the suction groove 18A, the various pattern(s), the scratch(es) and the like that are located on the upper surface of the stage 18. The pattern included in the image for inspection represents planar shapes of the suction groove 18A, various pattern(s), the scratch(es), the one or more particles and the like. The position information for inspection represents positions of the suction groove 18A, the various pattern(s), the scratch(es), the one or more particles and the like. Each of the positions of the one or more particles is represented by coordinates of two vertices located on a diagonal line of a circumscribed rectangle of the corresponding one or more particles in the XY coordinate system that has the origin located at the center C of the upper surface of the stage 18, in a manner similar to the suction groove 18A, the various pattern(s), the scratch(es) and the like.

The certain point in time is, for example, a point of time when an operator of the inspection device 10 presses an execution button to cause the inspection device 10 to detect the foreign object, or a point of time when a time counted by the controller 13 reaches a point of time that is set to the controller 13 by the operator of the inspection device 10. The point of time set to the controller 13 is, for example, a point of time when the inspection device 10 starts lot processing, a point of time on a specific day at a specific time of every month, a point of time when the number of the lots reaches a designated number set to the controller 13, or the like. A timing for detecting the foreign object can be set by the operator to the inspection device 10. The number of the lots is a number of the wafers W that are mounted on the stage 18 so as to perform the operation test of the electronic devices.

In the lot processing, the wafer W is transferred from the cassette C to the stage 18 by the transfer arm 15, the wafer W is mounted on the upper surface of the stage 18, the position of the wafer W is aligned by the alignment apparatus 20, and the probe needles are pressed against the terminals or the like of the electronic devices of the wafer W so as to inspect the electrical characteristics of the electronic devices. The lot processing starts with transferring the wafer W and ends with a completion of the inspection of the electrical characteristics.

When the wafer W is conveyed to the upper surface of the stage 18 by the transfer arm 15 in a state where the foreign object is located on the upper surface of the stage 18, the foreign object is sandwiched between a lower surface of the wafer W and the upper surface of the stage 18. If the wafer W is sucked onto the upper surface of the stage 18 by the vacuum chuck in this situation, a stress is concentrated at a contact point between the wafer W and the foreign object. In this situation the foreign object acts as a protrusion placed on the upper surface of the stage 18. Therefore, the wafer W may be damaged by the stress.

In order to suppress the damage of the wafer W from occurring, the controller 13 includes a function as the "detection apparatus for detecting a foreign object on a stage", and executes processes of the "method of detecting a foreign object on a stage" by utilizing the seven functions as described above. The details of the seven functions will be described hereinafter.

Figure 3:
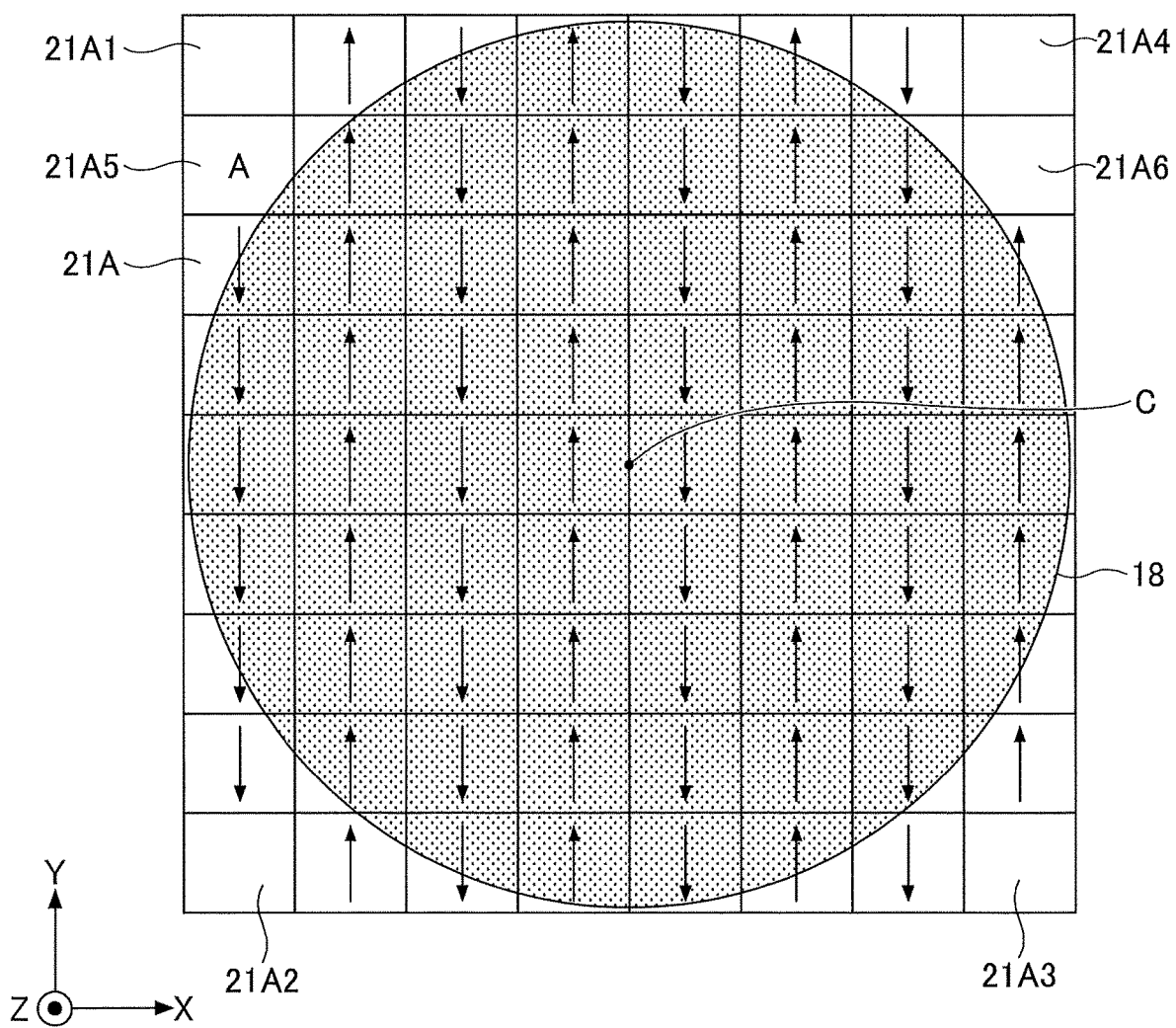
FIG. 3 is a diagram illustrating an example of imaging order for acquiring a reference image and an image for inspection by a training function and a particle detection function, respectively.

FIG. 3 is a diagram illustrating an example of imaging order for acquiring the reference image and the image for inspection by the training function and the particle detection function, respectively. In FIG. 3, the center C of the stage 18 is illustrated, but the suction groove 18A and holes for storing the pins 19 are omitted.

In FIG. 3, as an example, a range that can be captured by single imaging performed by the camera 21 is illustrated as a rectangularly shaped area 21A. For example, FIG. 3 illustrates the seventy-two areas 21A in a state where eight areas 21A are arranged in the X direction and nine areas 21A are arranged in the Y direction. Since a length in the X direction of the area 21A is longer than that in the Y direction, the number of the areas 21A arranged in the Y direction is greater than the number of the areas 21A arranged in the Y direction. The seventy-two areas 21A cover a rectangular area that is slightly larger than an outer periphery of the stage 18 having a circular shape in plan view. The numbers of the areas 21A arranged in the X direction and the Y direction are examples, and may be any number. The seventy-two areas 21A includes four areas 21A1 to 21A4 located at four corners, respectively. Among the four areas 21A1 to 21A4, the area 21A1 is placed at an end on a negative side in the X direction and an end on a positive side in the Y direction, and the area 21A4 is placed at an end on a positive side in the X direction and the end on the positive side in the Y direction. The seventy-two areas 21A include areas 21A5 and 21A6. The area 21A5 is placed next to the area 21A1, and is placed on the negative side in the Y direction. The area 21A6 is placed next to the area 21A4, and is placed on the negative side in the Y direction.

Since the four areas 21A1 to 21A4 located at four corners, respectively, among the seventy-two areas 21A do not overlap with the stage 18, the camera 21 may capture images in the sixty-eight areas 21A other than the four areas 21A1 to 21A4 located at the four corners, respectively. The sixty-eight areas 21A include the areas 21A5 and 21A6. For example, if the camera 21 moves along arrows that extend from the area 21A5 to the area 21A6 and captures the images in the sixty-eight areas 21A in order, the camera 21 can capture the sixty-eight images in the sixty-eight areas 21A, respectively. Accordingly, the camera 21 can capture the images in all of the areas 21A located on the upper surface of the stage 18.

When the camera 21 captures the images in the sixty-eight areas 21A, respectively, the controller 13 drives the X-stage 16X and Y-stage 16Y so that a visual field in which the camera 21 can capture the image corresponds to each of the areas 21A.

Next, the seven functions of the controller 13 will be described.

The training function acquires the reference data (training data) that includes the reference position information acquired from the reference image of the upper surface of the stage 18 when the upper surface of the stage 18 is cleaned (washed) and the imaging condition when the reference image is captured, and stores the reference data in the internal memory. The controller 13 performs the cleaning by driving the blower 15A to blow the nitrogen gas onto the upper surface of the stage 18. Herein, an example of the cleaning device is the blower 15A. However, a device for performing a pure water cleaning for spraying the pure water or an ethanol cleaning for spraying ethanol, instead of the blower 15A, or in addition to the blower 15A, may be used as the cleaning device.

The reference image can be acquired by dividing the upper surface of the stage 18 into the sixty-eight areas 21A as illustrated in FIG. 3, and by causing the camera 21, controlled by the controller 13, to image in each of the sixty-eight areas 21A at a low magnification. The imaging conditions may include a type of illumination (bright-field or dark-field), the date and the time of imaging, a temperature of the stage 18 when the imaging is performed, and the like. The operator of the inspection device 10 can select the type of illumination from the bright-field and the dark-field. For example, a setting temperature of the heater 18B may be used as the temperature of the stage 18.

For example, the sixty-eight areas 21A are distinguished in the XY coordinate system that has the origin located at the center C of the upper surface of the stage 18, and an XY coordinate of each pixel included in each of the sixty-eight areas 21A is represented in the XY coordinate system having the origin located at the center C of the upper surface of the stage 18.

The particle detection function acquires the position information for inspection from the image for inspection obtained by capturing the upper surface of the stage 18 at the certain point in time after capturing the reference image, compares the position information for inspection with the reference position information, and detects the particle located on the upper surface of the stage 18. For example, the certain point in time is, as described above, the point of time when the operator of the inspection device 10 presses the execution button to cause the inspection device 10 to detect the foreign object, the point of time when the number of the lots reaches the designated number set to the controller 13, the point of time when the time counted by the controller 13 reaches the point of time that is set to the controller 13 by the operator of the inspection device 10, or the like. The detection of the particle located on the upper surface of the stage 18 is a process of comparing the position information for inspection with the reference position information and detecting the particle based on a difference between the position information for inspection and the reference position information. More specifically, in a case where position information, included in the position information for inspection, that is not included in the reference position information satisfies a designated condition, the position information is treated as position information representing the particle. The particle is detected in this manner.

An imaging condition is also acquired when acquiring an image for inspection. The imaging condition of the image for inspection includes, by way of example, the type of the illumination (the bright-field or the dark-field), the date and the time of the imaging, the temperature of the stage 18 during the imaging, and the like. The same applies to the imaging condition of the reference image.

The designated condition as described above represents a minimum area or a minimum size of the foreign object. The minimum area or the minimum size of the foreign object is a minimum area in plan view or a minimum size in plan view of the particle that is recognized as the foreign object, in a case of determining whether the foreign object is present on the upper surface of the stage 18 according to the foreign object determination function. Details of the foreign object determination function will be described hereinafter. For example, the area of the particle is an area of the circumscribed rectangle of the particle. For example, the size of the particle is defined by a diameter of the particle in plan view or a length of a long side of the circumscribed rectangle of the particle. The operator may choose whether to determine the foreign object by the minimum area or the minimum size.

Upon detecting the difference between the position information for inspection and the reference position information as the particle, the particle detection function may correct the position information for inspection based on the temperature difference of the stage 18 when detecting the image for inspection and when detecting the reference image, and detect a difference between the corrected position information for inspection and the (uncorrected) reference position information as the particle. The correction of the position information for inspection may be performed so as to correct the X coordinate and the Y coordinate in the XY coordinate system having the origin located at the center C of the upper surface of the stage 18 by using a linear expansion coefficient and the temperature difference of the stage 18. For example, the stage 18 is made of aluminum, and a degree of expansion of the stage 18 may be different depending on the setting temperature of the heater 18B. Therefore, it is possible to suppress a difference corresponding to a displacement caused by thermal expansion of a structure such as the suction groove 18A located on the upper surface of the stage 18 from being detected as the particle. Alternatively, the particle detection function may correct the reference position information based on the temperature difference of the stage 18 when detecting the image for inspection and when detecting the reference image, and detect a difference between the corrected reference position information and the (uncorrected) position information for inspection as the particle.

The foreign object detection function is a function to determine a particle having an area or a size greater than or equal to the minimum area of the foreign object or the minimum size of the foreign object, among the particles detected by the particle detection function, as the foreign object. Determining whether the particle having the area or the size greater than or equal to the minimum area or the minimum size is equivalent to detecting the foreign object included in the one or more particles detected by the particle detection function. In other words, the foreign object detection function is a function to determine whether the particle detected by the particle detection function is a no-problem particle (an acceptable particle) or a problem particle (an unacceptable particle). The unacceptable particle is determined as the foreign object.

The recovery function is a function to recover from an abnormal state on the upper surface of the stage 18 when the particle determined as the foreign object by the foreign object detection function is present on the upper surface of the stage 18. The recovery function is also a function to cause the controller 13 to drive the blower 15A, and to remove the foreign object on the upper surface of the stage 18. As a result, the upper surface of the stage 18 is recovered from the abnormal state. The recovery function performs a step for cleaning the foreign object on the upper surface of the stage 18 so as to make the upper surface in a condition where there is no risk that the wafer W is damaged, even if the wafer W is mounted on the upper surface of the stage 18 and attracted by the vacuum chuck.

The recovery function includes a function to capture, after performing the step of cleaning the upper surface of the stage 18, an image (an image for reinspection) of the upper surface of the cleaned stage 18. The recovery function further includes a function to compare position information (position information for reinspection) of a pattern included in the image for reinspection with the reference position information stored in the internal memory, and to determine whether the foreign object is present on the upper surface of the stage 18. The image for reinspection is an example of a third image. The position information for reinspection is an example of a third position information, and the pattern included in the image for reinspection is an example of a third pattern.

The capture of the image for reinspection, an acquisition of the position information for reinspection, and the detection of the particle on the upper surface of the stage 18, according to the recovery function, may be performed in a manner similar to that of the capture of the image for inspection, the acquisition of the position information for inspection, and detection of the particle on the upper surface of the stage 18 according to the particle detection function. Moreover, the determination of whether or not the detected particle includes the foreign object, according to the recovery function, may be performed in a manner similar to the determination according to the foreign object determination function.

The operator call function is a function to notify the operator of a request to determine how to respond to the abnormal state on the upper surface of the stage 18. The controller 13 utilizes the operator call function in a case where the foreign object is detected after the step of cleaning the upper surface of the stage 18 being performed by the recovery function.

The controller 13 performs the operator call function so as to execute a step for notifying the operator of the abnormal state and a step for notifying the operator of the request to determine whether to continue the lot processing. The step for notifying the operator of the request to determine whether to continue the lot processing is one example of a step for notifying the operator of the request to determine how to respond to the abnormal state.

The controller 13 performs the step of notifying the operator of the abnormal state by utilizing the operator call function, in a case where the foreign object is detected by comparing the position information for reinspection with the reference position information after cleaning the upper surface of the stage 18 by the recovery function. The controller 13 displays an alert (an alarm) on the display 14, as a notification of the abnormal state, for example. Alternatively, the controller 13 may issue an alert of a sound, a voice or the like in addition to displaying the alert on the display 14, or instead of displaying the alert on the display 14.

The controller 13 executes a step for notifying the operator of the request to determine whether to continue the lot processing, in parallel with the step for notifying the operator of the abnormal state. In the step of notifying the operator of the request to determine whether to continue the lot processing, the controller 13 displays an image or the like representing the foreign object on the display 14 and displays a message requesting the operator to determine whether to continue the lot processing on the display 14.

Accordingly, the operator can check the image or the like of the foreign object detected by comparing the position information for reinspection, obtained after cleaning the upper surface of the stage 18 by the recovery function, with the reference position information, and can determine to continue the lot processing or to stop the current lot processing (lot end), for example.

The step performed by the recovery function and the step performed by the operator call function are executed as steps of an abnormal processing mode to deal with the abnormal state in which the foreign object is located on the upper surface of the stage 18. The step performed by the recovery function is a step of recovering the upper surface of the stage 18. Accordingly, the steps of the abnormal processing mode include a step of the abnormal processing performed by the recovery function and a step of the abnormal processing performed by the operator call function.

However, the abnormal processing mode may provide the operator with a selection of any one of the step of the abnormal processing performed by the recovery function and the step of the abnormal processing performed by the operator call function. The abnormal processing mode has a configuration in that the operator can select any one of the step of the abnormal processing performed by the recovery function and the step of the abnormal processing performed by the operator call function as the step of the abnormal processing mode.

The result check function is a function to make the controller 13 perform the following display processes on the display 14, for example, so that the operator can check a situation of the inspection device 10. Contents that the operator can check are a surface condition of the upper surface of the stage 18 and a situation of the foreign object. The operator can operate the X-stage 16X and Y-stage 16Y to check the surface condition.

When the controller 13 performs a mode in which the operator checks the surface condition, the controller 13 moves the X-stage 16X and the Y-stage 16Y in accordance with operations input to a joystick or the like by the operator and displays the image of the upper surface of the stage 18 captured by the camera 21 on the display 14. When the controller 13 performs a mode in which the operator checks the situation of the foreign object, the controller 13 displays the image of the foreign object, on the display 14, detected by comparing the position information for reinspection, acquired after cleaning the upper surface of the stage 18 by the recovery function, with the reference position information.

For example, the storage function is a function in which the controller 13 stores data generated at steps from a step of acquiring the position information for inspection to the step performed by the recovery function and the step performed by the operator call function.

The data stored by the storage function with respect to the particle detection function includes, for example, data representing the image for inspection that includes the image of the particle, located on the upper surface of the stage 18 and detected by the particle detection function, data representing the position information for inspection, and data representing the imaging conditions and the like generated when capturing the image for inspection.

The data stored by the storage function with respect to the foreign object detection function includes, for example, data representing the image for inspection that includes the image of the particle determined as the foreign object by the foreign object detection function, and data representing the imaging condition when capturing the image for inspection that includes the image of the particle determined as the foreign object. More specifically, among a plurality of the images for inspection including the image data of the particle detected by the particle detection function, the images for inspection including the image data of the particle that is determined as the foreign object by the foreign object detection function are continued to be stored in the internal memory by the storage function, but the images for inspection including the image data of the particle that is not determined as the foreign object are deleted from the internal memory by the storage function.

The data stored by the storage function with respect to the recovery function includes, for example, data related to processes, such as the cleaning and the like, performed by the recovery function, data representing the position information for reinspection, data representing the comparison result of the position information for reinspection with the reference position information, data representing the image of the foreign object detected by the recovery function, data representing the imaging conditions for the reinspection, and the like.

The data stored by the storage function with respect to the operator call function is, for example, data representing the content of the alert, data representing the result of the operator's determination and the like. The operator's determination is the operator's choice regarding whether to continue the lot processing or to end the lot processing.

The data stored by the storage function with respect to the result check function is, for example, data representing the content checked by the operator, i.e., data representing the surface condition of the upper surface of the stage 18 and the situation of the foreign object.

FIG. 4 is a flowchart illustrating an example of processes performed by the controller 13 when acquiring the reference data.

As the processes start, the controller 13 operates the camera 21 and the X-stage 16X and Y-stage 16Y, and captures the reference image that constitutes the image of the upper surface of the stage 18 in a state where the upper surface of the stage 18 is cleaned (step S1). The process of step S1 is performed by the training function. In step S1, the sixty-eight images are acquired in the sixty-eight areas 21A illustrated in FIG. 3, respectively, and the reference image composed of the sixty-eight images is acquired. At this time, the controller 13 also acquires the imaging conditions of the reference image.

The controller 13 acquires the reference position information by performing image processing on the reference image (step S2).

The controller 13 stores the reference data including the reference position information and the imaging condition of the reference image in the internal memory (step S3). The process of step S3 is performed by the training function.

Thereby, the processes performed when acquiring the reference image are completed (end).

FIG. 5 is a flowchart illustrating an example of processes performed for acquiring the position information for inspection and for detecting the foreign object.

The controller 13 reads out the reference data including the reference position information and the imaging condition of the reference image from the internal memory (step S11). The process in step S11 is performed by the particle detection function.

The controller 13 operates the camera 21 and the X-stage 16X and Y-stage 16Y, captures the image for inspection that constitutes the image on the upper surface of the current stage 18, and acquires the position information for inspection (step S12). The process of step S12 is performed by the particle detection function. The controller 13 stores the inspection data including the position information for inspection and the imaging condition when the image for inspection is captured in the internal memory. This process is performed by the storage function.

The controller 13 compares the position information for inspection with the reference position information and detects one or more particles located on the upper surface of the stage 18 (step S13). The one or more particles are detected from the difference between the position information for inspection and the reference position information. The process of step S13 is performed by the particle detection function. If there is a temperature difference between the stage 18 when the image for inspection is captured and the stage 18 when the reference image is captured, the controller 13 may perform the correction in consideration of the expansion of the stage 18. The controller 13 stores the data of the image of the one or more particles that represent the difference between the image for inspection and the reference image in the internal memory. This process is performed by the storage function.

The controller 13 determines whether the foreign object is present among the one or more particles detected at step S13 (step S14). At step S14, the controller 13 determines the particle having the area or the size greater than or equal to the minimum area of the foreign object or the minimum size of the foreign object as the foreign object. The process at step S14 is performed by the foreign object detection function, and is performed so as to detect the foreign object. In a case where the controller 13 determines that there is the foreign object at step S14, the controller 13 stores the data representing the image of the particle determined as the foreign object, the imaging conditions when capturing the image for inspection including the image of the particle determined as the foreign object, and the like in the internal memory. This process is performed by the storage function.

In a case where the controller 13 determines that there is the foreign object (S14: YES), the controller 13 performs a process for recovering from the abnormal state on the upper surface of the stage 18 (step S15). More specifically, the controller 13 drives the blower 15A so as to blow off the foreign object on the upper surface of the stage 18 and to clean and recover the upper surface, for example. The process at step S15 is performed by the recovery function.

The controller 13 operates the camera 21 and the X-stage 16X and Y-stage 16Y to capture the image for reinspection and acquires the position information for reinspection (step S16). The image for reinspection is the image of the upper surface of the current stage 18 after the recovery process is performed. The process at step S16 is performed by the recovery function. The controller 13 stores the data related to the processes such as the cleaning and the like, the data representing the position information for reinspection, and the data representing the imaging conditions of the image for reinspection in the internal memory. This process is performed by the storage function.

The controller 13 compares the position information for reinspection with the reference position information and detects the one or more particles on the upper surface of the stage 18 (step S17). The process at step S17 is performed by the recovery function, and the same process as that of step S13 is performed with respect to the position information for reinspection. The controller 13 stores the data representing the comparison result of the reference position information with the position information for reinspection in the internal memory. This process is performed by the storage function.

The controller 13 determines whether the foreign object is present among the one or more particles detected at step S17 (step S18). At step S18, the controller 13 determines the particle having the area or the size greater than or equal to the minimum area of the foreign object or the minimum size of the foreign object as the foreign object. The process at step S18 is performed by the recovery function, and the same process as that of step S14 is performed with respect to the particles detected in step S17. In a case where the controller 13 determines that there is the foreign object in step S13, the controller 13 stores the data representing the image of the particle determined as the foreign object and the imaging condition when capturing the image for reinspection including the image of the particle determined as the foreign object in the internal memory. This process is performed by the storage function.

In a case where the controller 13 determines that the foreign object is present, the controller 13 notifies the operator of the abnormal state and requests the operator to determine whether to continue the lot processing (step S19). More specifically, for example, the controller 13 displays the alert (the alarm) on the display 14, and displays the message requesting the operator to determine whether to continue the lot processing on the display 14. At this time, the controller 13 may display an image or the like representing the foreign object on the display 14. The process at step S19 is performed by the operator call function.

The controller 13 displays the current status on the display 14, in accordance with the operations performed by the operator, so as to allow the operator to check the current status through the display 14 (step S20). Specifically, for example, the controller 13 makes it possible for the operator to check the surface condition of the upper surface of the stage 18 by operating the X-stage 16X and the Y-stage 16Y and to check the foreign object. The controller 13 moves the X-stage 16X and the Y-stage 16Y in accordance with operations input to a joystick or the like by the operator. The process at step 320 is performed by the result check function.

Upon completion of the processing at step S20, the controller 13 completes a series of processing (end). In a case where the series of processes is completed via step S20, the controller 13 can inspect the electrical characteristics of the wafer W in accordance with the operator's input that is performed corresponding to the notification in step S19. For example, the operator's input performed at step S19 represents the operator's choice regarding whether to continue the lot processing or to end the lot processing.

In a case where the controller 13 determines that there is no foreign object at step S14 or S18, the controller 13 completes the series of processing (end). If the controller 13 determines that there is no foreign object at step S14, there is no foreign object on the upper surface of the stage 18. Accordingly, the controller 13 ends the series of processing. If the controller 13 determines that there is no foreign object at step S18, the foreign object located on the upper surface of the stage 18 is blown off by the cleaning. Accordingly, the controller 13 ends the series of processing. In a case where the series of processes is completed via step S14 or S18, the controller 13 can inspect the electrical characteristics of the wafer W in accordance with the operator's input.

The abnormal processing mode may provide the operator with a selection of any one of the step of the abnormal processing performed by the recovery function and the step of the abnormal processing performed by the operator call function. In a case where the controller 13 executes the abnormal processing performed by the recovery function (steps S15 to S18) and does not execute the step of the abnormal processing performed by the operator call function (S19), the flow proceeds to step S20 after determining YES at step S18. In this case, at step S20, the operator checks the surface condition of the upper surface of the stage 18 and the foreign object.

In a case where the controller 13 does not execute the abnormal processing performed by the recovery function (steps S15 to S18) but executes the step of the abnormal processing performed by the operator call function (S19), the flow proceeds to step S19 after determining YES at step S14. In this case, at step S19, the controller 13 displays the alert (the alarm) on the display 14, and displays the message requesting the operator to determine how to respond to the abnormal state on the display 14.

As described above, the controller 13 detects the particle based on the difference between the reference position information acquired in a state where the upper surface of the stage 18 is cleaned and the position information for inspection acquired in a state where the upper surface of the stage 18 is used for the lot processing after the cleaning. Then the controller 13 detects the particle having the minimum area of the foreign object or the minimum size of the foreign object as the foreign object among the detected one or more particles. Therefore, it is possible to detect the foreign object located on the upper surface of the stage 18.

Accordingly, it is possible to provide the method of detecting a foreign object on a stage and the detection apparatus for detecting a foreign object on a stage that can detect the foreign object located on the upper surface of the stage 18 that is capable of attracting the wafer W. Since the foreign object located on the upper surface of the stage 18 can be detected, the inspection of the electrical characteristics can be performed stably. Therefore, the inspection with high throughput can be performed.

When detecting the foreign object, the controller 13 detects the particle having the minimum area of the foreign object or the minimum size of the foreign object as the foreign object. Accordingly, it is possible to detect the foreign object, efficiently, among the one or more particles detected by using the image processing.

The controller 13 detects the particle after performing the correction based on the temperature difference of the stage 18 when detecting the image for inspection and when detecting the reference image, and detects the foreign object. Accordingly, it is possible to detect the foreign object, more precisely, in consideration of the degree of the expansion of the stage 18 when detecting the image for inspection and the degree of the expansion of the stage 18 when detecting the reference image.

When the foreign object is detected, the controller 13 executes the abnormal processing mode including the step of recovering the upper surface of the stage 18 or the step of requesting the operator to determine whether to continue the lot processing. Therefore, it is possible to continue the lot processing depending on a condition of the abnormal state, even when the foreign object is detected on the upper surface of the stage 18. In particular, if the controller 13 executes the recovery process so as to clean the upper surface of the stage 18, it is possible to continue the lot processing after removing the foreign object.

In the step of recovering the upper surface of the stage 18, the controller 13 detects the particle having the minimum area of the foreign object or the minimum size of the foreign object as the foreign object. Accordingly, it is possible to detect the foreign object, efficiently, among the one or more particles detected by using the image processing.

The controller 13 detects the particle after performing the correction based on the temperature difference of the stage 18 when detecting the image for reinspection and when detecting the reference image, and detects the foreign object. Accordingly, it is possible to detect the foreign object, more precisely, in consideration of the degree of the expansion of the stage 18 when detecting the image for reinspection and the degree of the expansion of the stage 18 when detecting the reference image.

The controller 13 executes the step for notifying the operator of the request to determine whether to continue the lot processing and a step of issuing the alert to the operator. It is therefore possible to notify the operator of an occurrence of the abnormal state with more certainty.

Further, the controller 13 executes the step of displaying the image of the upper surface of the stage 18 on the display 14 after executing the step of recovering the upper surface of the stage 18 or the step of notifying the operator of the request to determine whether to continue the lot processing. Accordingly, the operator can easily check the condition of the upper surface of the stage 18.

Although the embodiment in which the stage 18 attracts the wafer W with the vacuum chuck is described above, an electrostatic chuck may be used instead of the vacuum chuck. In a case where a chuck other than the vacuum chuck such as the electrostatic chuck or the like is used, the same effect as described above for the case where the vacuum chuck is used can be obtained.

Although the embodiment of the method of detecting a foreign object on a stage and detection apparatus for detecting a foreign object on a stage is described using the inspection device 10, the method of detecting a foreign object on a stage and detection apparatus for detecting a foreign object on a stage can be applied to deposition apparatus, an etching apparatus, and the like.

According to one aspect of the present disclosure, it is possible to detect the foreign object on the surface of the stage capable of attracting the object to be inspected.

The embodiments described herein should be considered to be examples in all respects and not limiting. The above embodiments may be omitted, substituted, or modified in various forms without departing from the appended claims and spirit thereof.

What is claimed is:

1. A method of detecting a foreign object on a stage performed by a computer, the method comprising:
    acquiring, with a processor, first position information that indicates positions of first patterns included in a first image of a surface of the stage capable of attracting an object to be inspected, wherein the first image is an image in a plan view of the stage obtained when the surface is in a reference state, and the first patterns indicate arrangements of planar shapes of components on the surface;
    storing, in a memory, the first position information;
    acquiring, with the processor, second position information that indicates positions of second patterns included in a second image of the surface, wherein the second image is an image in the plan view of the stage obtained after obtaining the first image, and the second patterns indicate arrangements of planer shapes of components on the surface;
    storing, in the memory, the second position information;
    detecting, with the processor, a difference between the first position information and the second position information; and
    automatically determining, with the processor, whether the surface includes a foreign object based on the difference.

2. The method of detecting a foreign object on a stage, as claimed in claim 1,
    wherein the detecting the one or more foreign objects includes:
        detecting particles on the surface by comparing the first position information and the second position information, and
        detecting one or more particles among the detected particles as the one or more foreign objects, the one or more particles having an area or a size greater than or equal to a threshold value.

3. The method of detecting a foreign object on a stage, as claimed in claim 2,
    wherein the detecting the particles on the surface includes:

correcting any one of the first position information and the second position information based on a temperature difference between a first temperature of the stage when the first image is obtained and a second temperature of the stage when the second image is obtained, and comparing the corrected position information among the first position information and the second position information and uncorrected position information among the first position information and the second position information.

4. The method of detecting a foreign object on a stage, as claimed in claim 1, wherein the detecting the one or more foreign objects on the surface includes:

correcting any one of the first position information and the second position information based on a temperature difference between a first temperature of the stage when the first image is obtained and a second temperature of the stage when the second image is obtained, and comparing the corrected position information among the first position information and the second position information and uncorrected position information among the first position information and the second position information.

5. The method of detecting a foreign object on a stage, as claimed in claim 1, further comprising:

executing an abnormal processing mode that responds to an abnormal state in which the one or more foreign objects are located on the surface in response to the one or more foreign objects being detected.

6. The method of detecting a foreign object on a stage, as claimed in claim 5, wherein the executing an abnormal processing mode includes:

recovering from the abnormal state, or notifying an operator of a request to determine how to respond to the abnormal state.

7. The method of detecting a foreign object on a stage, as claimed in claim 6, wherein the recovering from the abnormal state includes: cleaning the surface.

8. The method of detecting a foreign object on a stage, as claimed in claim 7, wherein the recovering from the abnormal state further includes:

acquiring third position information of a third pattern included in a third image of the surface that is cleaned by the cleaning, and detecting the one or more foreign objects on the surface that is cleaned by the cleaning by comparing the first position information and the third position information.

9. The method of detecting a foreign object on a stage, as claimed in claim 8, wherein the detecting one or more foreign objects on the surface that is cleaned by the cleaning includes:

correcting any one of the first position information and the third position information based on a temperature difference between a first temperature of the stage when the first image is obtained and a third temperature of the stage when the third image is obtained, and comparing the corrected position information among the first position information and the third position information and uncorrected position information among the first position information and the third position information.

10. The method of detecting a foreign object on a stage, as claimed in claim 6, wherein the notifying the operator of the request to determine how to respond to the abnormal state includes:

displaying on a display a message that requests the operator to determine how to respond to the abnormal state.

11. The method of detecting a foreign object on a stage, as claimed in claim 10, wherein the notifying the operator of the request to determine how to respond to the abnormal state further includes:

informing the operator of the abnormal state.

12. The method of detecting a foreign object on a stage, as claimed in claim 6, wherein the executing an abnormal processing mode further includes:

displaying an image of the surface of the stage on a display in accordance with an operation of the operator after the recovering from the abnormal state or the notifying the operator of the request to determine how to respond to the abnormal state.

13. The method according to claim 1, wherein the components include at least one of a suction groove, a scratch, a pattern, and a particle.

14. A detection apparatus for detecting a foreign object on a stage, the stage being capable of attracting an object to be inspected, and the detection apparatus comprising:

a processor that acquires first position information that indicates positions of first patterns included in a first image of a surface of the stage, wherein the first image is an image in a plan view of the stage obtained when the surface is in a reference state, and the first patterns indicate arrangements of planar shapes of components on the surface; and a memory that stores the first position information, wherein the processor acquires second position information that indicates positions of second patterns included in a second image of the surface, the second image being an image in the plan view of the stage obtained after obtaining the first image, and the second patterns indicating arrangements of planer shapes of components on the surface, the memory stores the second position information, the processor detects a difference between the first position information and the second position information, and the processor automatically determines whether the surface includes a foreign object based on the difference.

* * * * *